United States Patent
Bonucci et al.

(10) Patent No.: US 9,595,626 B2
(45) Date of Patent: Mar. 14, 2017

(54) METHOD FOR MANUFACTURING PHOTOVOLTAIC PANELS BY THE USE OF A POLYMERIC TRI-LAYER COMPRISING A COMPOSITE GETTER SYSTEM

(75) Inventors: Antonio Bonucci, Milan MI (IT);
Sergio Rondena, Magenta MI (IT);
Giorgio Longoni, Monza MI (IT);
Marco Amiotti, Cornaredo MI (IT);
Luca Toia, Carnago VA (IT)

(73) Assignee: SAES GETTERS S.P.A., Lainate (MI) (IT)

( * ) Notice: Subject to any disclaimer, the term of this patent is extended or adjusted under 35 U.S.C. 154(b) by 30 days.

(21) Appl. No.: 13/016,435

(22) Filed: Jan. 28, 2011

(65) Prior Publication Data
US 2011/0209760 A1    Sep. 1, 2011

Related U.S. Application Data

(62) Division of application No. 12/679,176, filed as application No. PCT/EP2008/062916 on Sep. 26, 2008, now Pat. No. 7,901,991.

(30) Foreign Application Priority Data

Oct. 4, 2007    (IT) .......................... MI2007A001903

(51) Int. Cl.
*H01L 31/048*    (2014.01)
(52) U.S. Cl.
CPC ............ *H01L 31/048* (2013.01); *Y02E 10/50* (2013.01); *Y10T 428/31924* (2015.04)

(58) Field of Classification Search
CPC  H01L 31/048; Y10T 428/31924; Y02E 10/50
See application file for complete search history.

(56) References Cited

U.S. PATENT DOCUMENTS

| | | | | | |
|---|---|---|---|---|---|
| 3,998,680 | A | * | 12/1976 | Flint | 156/109 |
| 4,134,927 | A | * | 1/1979 | Tomoshige et al. | 525/245 |
| 4,382,999 | A | * | 5/1983 | Harima et al. | 428/494 |
| 4,453,997 | A | | 6/1984 | Hori et al. | |
| 4,927,675 | A | * | 5/1990 | Adams et al. | 428/35.9 |

(Continued)

FOREIGN PATENT DOCUMENTS

| | | |
|---|---|---|
| BE | 1013036 | 8/2001 |
| EP | 0631328 | 12/1994 |

(Continued)

OTHER PUBLICATIONS

English translation of Office Action issued by JPO for JP Application No. 2010-527415 with a mailing date of Nov. 2, 2010.

(Continued)

*Primary Examiner* — Kevin R Kruer
(74) *Attorney, Agent, or Firm* — Steinfl + Bruno LLP

(57) ABSTRACT

The present invention relates to a method for manufacturing thin-film photovoltaic panels by the use of a sealing means composed by a polymeric tri-layer comprising a composite getter system composed of a polymer with a low $H_2O$ transmission, having dispersed in its inside a $H_2O$ sorption material, and two outer polymeric layers with the composite getter system therebetween, as well as to a polymeric tri-layer for the manufacturing of photovoltaic panels.

19 Claims, 3 Drawing Sheets

(56) References Cited

U.S. PATENT DOCUMENTS

Figure 1A:
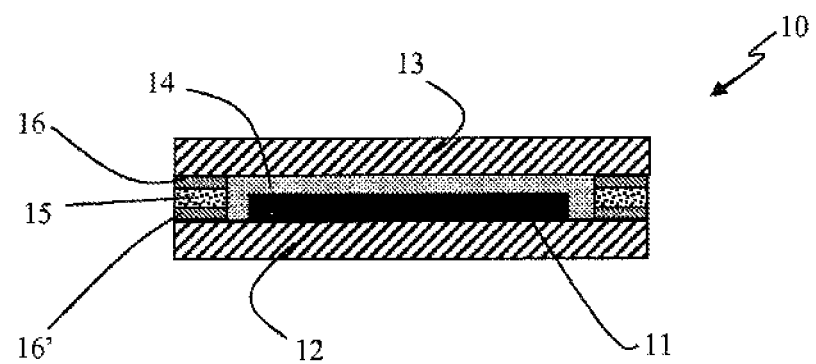

| | | | |
|---|---|---|---|
| 5,304,419 A | 4/1994 | Shores | |
| 5,401,536 A | 3/1995 | Shores | |
| 5,478,402 A | 12/1995 | Hanoka | |
| 5,548,012 A | 8/1996 | Aritake et al. | |
| 5,733,382 A | 3/1998 | Hanoka | |
| 5,789,859 A * | 8/1998 | Watkins et al. | 313/495 |
| 5,874,804 A | 2/1999 | Rogers | |
| 6,059,860 A * | 5/2000 | Larson | 95/117 |
| 6,187,448 B1 | 2/2001 | Hanoka et al. | |
| 6,358,580 B1 * | 3/2002 | Mang et al. | 428/35.7 |
| 6,534,571 B1 | 3/2003 | Hoover | |
| 6,777,481 B2 * | 8/2004 | Chu | 524/450 |
| 6,936,131 B2 | 8/2005 | McCormick et al. | |
| 7,078,726 B2 | 7/2006 | Pichler et al. | |
| 7,335,422 B2 * | 2/2008 | Dick et al. | 428/500 |
| 7,462,651 B2 | 12/2008 | Cao et al. | |
| 7,589,465 B2 * | 9/2009 | Carr | 313/546 |
| 7,901,991 B2 | 3/2011 | Bonucci et al. | |
| 8,310,155 B2 * | 11/2012 | Allemand | 313/512 |
| 2002/0183431 A1 | 12/2002 | Kawaguchi et al. | |
| 2003/0079772 A1 | 5/2003 | Gittings et al. | |
| 2003/0222413 A1 | 12/2003 | Hatanka | |
| 2005/0284516 A1 | 12/2005 | Koll | |
| 2006/0049396 A1 | 3/2006 | Pichler et al. | |
| 2007/0144576 A1 | 6/2007 | Crabtree et al. | |
| 2008/0185701 A1 | 8/2008 | Foust et al. | |
| 2009/0178800 A1 * | 7/2009 | Korte et al. | 166/187 |
| 2010/0151139 A1 | 6/2010 | Low et al. | |
| 2014/0106096 A1 * | 4/2014 | Doutt et al. | 428/35.2 |

FOREIGN PATENT DOCUMENTS

| | | | |
|---|---|---|---|
| EP | 1270675 | | 1/2003 |
| EP | 1617494 | | 1/2006 |
| EP | 1788034 | | 5/2007 |
| GB | 1231569 | * | 5/1971 |
| JP | 401161079 | * | 6/1989 |
| JP | 5235392 | | 10/1993 |
| JP | 2009-116180 | | 5/1997 |
| JP | 2004-291224 | | 10/2004 |
| JP | 2004-311385 | | 11/2004 |
| JP | 2007-250082 | | 9/2007 |
| JP | 2010-527406 | | 12/2010 |
| TW | 571601 | | 1/2004 |
| WO | 01/88041 | | 11/2001 |
| WO | 03-050891 | | 6/2003 |
| WO | 2004/019421 | | 3/2004 |
| WO | 2007/071703 | | 6/2007 |

OTHER PUBLICATIONS

PCT International Search Report for PCT/EP2008/062916 filed on Sep. 26, 2008 in the name of SAES GETTERS S.P.A.
PCT Written Opinion for PCT/EP2008/062916 filed on Sep. 26, 2008 in the name of SAES GETTERS S.P.A.
PCT International Preliminary Report on Patentability for PCT/EP2008/062916 filed on Sep. 26, 2008 in the name of SAES GETTERS S.P.A.
PCT International Search Report for PCT/EP2008/062782 filed on Sep. 24, 2008 in the name of SAES GETTERS S.P.A.
PCT Written Opinion for PCT/EP2008/062782 filed on Sep. 24, 2008 in the name of SAES GETTERS S.P.A.
PCT International Preliminary Report on Patentability for PCT/EP2008/062782 filed on Sep. 24, 2008 in the name of SAES GETTERS S.P.A.
Wronski, C.R., et al., Progess in Amorphous Silicon Based Solar Cell Technology, World Climate & Energy Event, Jan. 6-11, 2002, 67-72.
Marais, S, et al., Permeation and Sorption of Water and Gases Through EVA Copolymers Films, Material Resources Innovation 2002, 6: 79-88.
Wennerberg, J., Design and Stability of Cu(In,Ga)Se$_2$ —Based Solar Cell Modules, Ph.D Thesis, Uppsala University, published in 2002.
Von Roedern, B., Status of Amorphous and Crystalline Thin-Film Silicon Solar Cell Activities, NCPV and Solar Program Review Meeting 2003, 552-555.
Romeo, A., et al., Development of Thin-film Cu(In,Ga)Se$_2$ and CdTe Solar Cells, Progess in Photovoltaics: Research and Applications 2004, 12: 93-111.
Carlsson, T., Stability Diagnostics for Thin-film Photovoltaic Modules, Ph.D Thesis, Helsinki University, published in 2006, 1-72.
Jorgensen, G.J., et al., Testing of Packaging Materials for Improved PV Module Reliability, NREL/CP-520-37366 2005, 1-7.
Jorgensen, G.J., et al., Moisture Transport, Adhesion, and Corrosion Protection of PV module Packaging Materials, Solar Energy Materials & Solar Cells 2006, 90: 2739-2775.
Notice of Allowance mailed on Dec. 27, 2010 for U.S. Appl. No. 12/679,176, filed on Jun. 21, 2010 in the name of Antonio Bonucci et al.
Chinese Office Action mailed on Aug. 31, 2011 for Chinese Application 200880109849.5 filed on in the name of SAES GETTERS S.P.A. (English translation with Chinese Text).
Chinese Office Action mailed on May 22, 2012 for Chinese Application 200880109847.6 filed on in the name of SAES GETTERS S.P.A. (English translation with Chinese Text).
Chinese Office Action mailed on Jul. 20, 2011 for Chinese Application 200880109847.6 filed on in the name of SAES GETTERS S.P.A. (English translation with Chinese Text).
Taiwanese Office Action issued for Taiwanese Application 097136907 filed on Sep. 25, 2008 in the name of SAES GETTERS S.P.A.
Minutes of Examiner Interview mailed on Sep. 24, 2010 for European Application 08804794.9 filed on Sep. 26, 2008 in the name of SAES GETTERS S.P.A.
Japanese Office Action mailed on Nov. 2, 2010 for Japanese Application 2010-527415 filed on in the name of SAES GETTERS S.P.A. (English translation with Japanese Text).
Minutes of Oral Proceedings mailed on Dec. 13, 2012 for European Application 08804686.7 filed on Sep. 24, 2008 in the name of SAES GETTERS S.P.A.
EP Communication 94.3 mailed on Nov. 12, 2010 for European Application 08804686.7 filed on Sep. 24, 2008 in the name of SAES GETTERS S.P.A.
EP Summons to Attend Oral Proceedings mailed on Jul. 9, 2012 for European Application 08804686.7 filed on Sep. 24, 2008 in the name of SAES GETTERS S.P.A.
Restriction Requirement mailed on Sep. 27, 2012 for U.S. Appl. No. 12/679,280, filed on Jul. 12, 2010 in the name of Sergio Rodena.
Non-Final Office Action mailed on Jan. 17, 2013 for U.S. Appl. No. 12/679,280, filed on Jul. 12, 2010 in the name of Sergio Rodena.
Notice of Reasons for Rejection (English translation only) mailed on Apr. 16, 2013 for Japanese application 2010-527406 filed on Sep. 24, 2008 in the name of SAES GETTERS S.P.A.
Decision of Final Rejection (English translation only) mailed on Jan. 7, 2014 for Japanese application 2010-527406 filed on Sep. 24, 2008 in the name of SAES GETTERS S.P.A.
Final Office Action mailed May 30, 2014 for U.S. Appl. No. 12/679,280, filed on Jul. 12, 2010 in the name of SAES GETTERS S.P.A.
Non-Final Office Action mailed Aug. 20, 2013 for U.S. Appl. No. 12/679,280, filed on Jul. 12, 2010 in the name of SAES GETTERS S.P.A.
Office Action issued for Chinese Patent Application No. 200880109847.6 in the name of SAES GETTERS S.P.A mail date: Mar. 19, 2014 (Original and English Translation).
Office Action issued for Chinese Patent Application No. 200880109847.6 in the name of SAES GETTERS S.P.A mail date: May 13, 2014 (Original and English Translation).

* cited by examiner

METHOD FOR MANUFACTURING PHOTOVOLTAIC PANELS BY THE USE OF A POLYMERIC TRI-LAYER COMPRISING A COMPOSITE GETTER SYSTEM

CROSS REFERENCE TO RELATED APPLICATIONS

The present application is a US Divisional Application of U.S. application Ser. No. 12/679,176 filed on Mar. 19, 2010, which, in turn, is the US national stage of International Application PCT/EP2008/062916 filed on Sep. 26, 2008, which, in turn, claims priority to Italian Application MI2007A001903, filed on Oct. 4, 2007, the contents of all of which are incorporated herein by reference in their entirety.

The present invention refers to a method for manufacturing photovoltaic panels by means of a polymeric tri-layer comprising a composite getter system for sorbing $H_2O$.

The terms photovoltaic and solar could be used to indicate the same or equivalent type of devices (panel, cells) and are to be considered technically equivalent, even though in the following it will be preferably employed the term photovoltaic panel.

A photovoltaic panel is composed of one or more photovoltaic elements (so-called cells) for the conversion of solar energy into electric energy. By the term photovoltaic cell reference is made to a single active element, that is the element that converts the light radiation into electric energy, while by photovoltaic panel reference is made to the final product, that is to the set of suitably interconnected photovoltaic cells, provided with electrical connections and finally encapsulated. A photovoltaic panel, sometimes also referred to in the field by the term photovoltaic module, may contain more than one photovoltaic cell (the number of photovoltaic cells can vary from 50 to 150). Typically in a thin-film panel the number of cells is about 80.

There are various types of photovoltaic cells. Among those recently developed, the thin-film photovoltaic cells are of particular interest, due to their conversion efficiency and industrial feasibility. In these cells the active element is deposited in form of a film on a (vitreous, metallic or plastic) substrate and is not present in the form of expensive stripes or slices as in the case of mono- or polycrystalline silicon photovoltaic cells. In these cells are also present metallizations placed in contact with the active element, having the function of interconnecting the cells as such and transporting the current generated by them.

Among the most interesting typologies of photovoltaic cells there are the cells based on cadmium-tellurium, amorphous silicon, copper-indium-selenium having gallium and sulphur added and the cells based on gallium arsenide. More information on the different typologies of photovoltaic cells and their functioning can be found in the article "Prowess in Amorphous Silicon Based Solar Cell Technology", by Wronski et al., presented at "World Climate & Energy Event" in 2002, in the article "Status of Amorphous and Crystalline Thin-Film Silicon Solar Cell Activities", by Bolko von Roedern, presented in 2003 at "NCPV and Solar Review Meeting" and in the article "Development of Thin-Film Cu(In,Ga)Se$_2$ and CdTe Solar Cells" by Romeo et al., published in "Progress in Photovoltaics: Research and Application" in 2004, volume 12, pp 93-111.

The final structure of the solar panel is rather standardized and independent on the specific type of photovoltaic cell and foresees the use of two, vitreous or plastic, supports to confine and enclose the photovoltaic element. These supports, one of which necessarily must be transparent to the light radiation, ensure also the mechanical stability and the protection from the atmospheric agents.

These supports are typically joined together by arranging an encapsulating polymer having good adhesive properties in the space between the two supports; in some cases there can also be spacing elements that fix the distance between the supports, while in other cases it is the thickness of the polymer to determine the distance between the supports. The method of the invention is applied to the latter type of structure.

In the following the supports are identified and distinguished between each other by the use of the terms "upper support" that refers to the support through which the radiation reaches the cell, and "lower support" that identifies the support on the back of the cell.

The photovoltaic element can be directly in contact with one of the inner surfaces of the supports of the photovoltaic module or can be completely encapsulated by a transparent, polymeric material having a low transmission for $H_2O$, that is a transmission lower than 10 g m-2 d-1 mm (grains of $H_2O$ per square meter per day for each millimeter of width of the material) at 25° C. and 60% of relative humidity (RH). In the technical field the transmission of water by the polymer can also be characterized by means of the MVTR, standing for Moisture Vapour Transmission Rate; the two are strictly correlated, the permeability being the MVTR multiplied by the thickness of the polymeric, material and divided by the pressure.

The polymeric material used for encapsulating the photovoltaic element is typically composed of EthylVinylAcetate (EVA); often used are also thermoplastic polyurethanes (TPU) and PolyVinylButyral (PVB). This polymeric material has essentially the aim to fill the inner volume of the photovoltaic panel giving to it at the same time also mechanical stability. By inner volume of the photovoltaic panel is intended the volume that is defined by the two supports and by the frame of the panel (typically formed of a polymer having good adhesive properties) that is not occupied by the photovoltaic element or by the other constructive elements of the photovoltaic panel (for example the electric contacts). If the photovoltaic element is in contact with one of the two supports (typically the lower one), it finds itself encapsulated on three sides by the encapsulating polymeric material.

The manufacturing process of a photovoltaic panel foresees also a process of thermosealing. In this regard two main types of processes are used, one foresees the use of a vacuum laminator, while the other foresees the use of an autoclave. In both cases the thermosealing is usually carried out between 100 and 170° C. This process results in the melting of the encapsulating polymer.

Independently from the specific type of photovoltaic cell, the presence of $H_2O$ inside the photovoltaic panel deteriorates the characteristics thereof; the deterioration mechanisms triggered by the presence of $H_2O$ act both at cell level, and at the solar module level. As far as the cell is concerned, the deterioration is due to the oxidation and the corrosion of the thin films that form the cell, while as far as the module is concerned, there is the corrosion of the metallizations used for the electric connections. Further information in this respect can be found in the Ph.D. thesis "Stability Diagnostics for Thin-Film Photovoltaic Modules" by T. Carlsson of Helsinki University, published in 2006, and in the Ph.D. thesis "Design and Stability of Cu(In,Ga)Se$_2$-Based Solar Cell Modules" by J. Wannerberg of Uppsala University, published in 2006.

The peripheral adhesion region, between the upper support and the lower support, which can also be seen as the frame of the panel, represents a preferential region for the ingress of water inside the device since the two supports, upper and lower one, are to be considered, in this case, impermeable for $H_2O$.

The problem of the presence of $H_2O$ inside the photovoltaic panel has been confronted according to three main approaches: introduction of a $H_2O$ sorbing material inside the panel; use of a barrier having low $H_2O$ transmission; use of a barrier having low $H_2O$ transmission and containing also a $H_2O$ sorbing element.

As far as the first type of solution is concerned, that is the inclusion of a sorbing material inside the photovoltaic cell or panel, this is described in the Japanese patent JP 2800528 B2, in which the use of various possible water sorbers is described, that are positioned in the photovoltaic cell in peripheral regions of the lower surface thereof. In this document the getter element is totally independent from the problem of sealing the photovoltaic panel.

The use of barriers having low $H_2O$ transmission, comprising a $H_2O$ getter material, is described in the patent application EP 1617494 A2, where such a barrier replaces the upper support of the photovoltaic panel.

The use of adhesives arranged in peripheral regions of the panel to make the upper and lower support stick to each other is described in the patent application WO 2004/019421, that specifies special types of adhesives having low $H_2O$ transmission, while the document WO 03/050891 describes sealing materials containing a limited weight percentage, between 0.1% and 10%, of a $H_2O$ sorber.

The main problem associated to the use of barriers or adhesives without gettering capacity is that, even if slowly, the ingress of $H_2O$ in the photovoltaic panel occurs in a continuous and progressive manner, thus causing a gradual deterioration of the characteristics of the panel.

This problem tends to show up after a relatively short time interval also in the case in which adhesives or sealing materials are used that comprise a limited quantity of getter material.

The use of a sealing element arranged along the edges of the panel having both the function of adhesive between the supports and of barrier against the entry of $H_2O$ and $H_2O$ sorber, entails notable restrictions on the final characteristics of this element and results in non-optimal compromise choices, for example limiting the quantity of sorbing material present in the composite getter system in order not to affect the adhesion of the composite getter system to the two supports.

Object of the present invention is to provide an improved method for manufacturing photovoltaic panels, capable of separating the problem of adhesion from the problem of $H_2O$ sorption and thus in a first aspect thereof it consists in a method for manufacturing a photovoltaic panel comprising one or more photovoltaic elements confined by two supports, characterized in that said supports, before being subjected to a thermosealing process, are joined together in proximity of the edge by means of three superimposed polymeric layers, in which the two outermost layers are composed of a polymeric material essentially without getter material, whereas the central layer is composed of a composite getter system for $H_2O$ sorption.

Figure 1B:
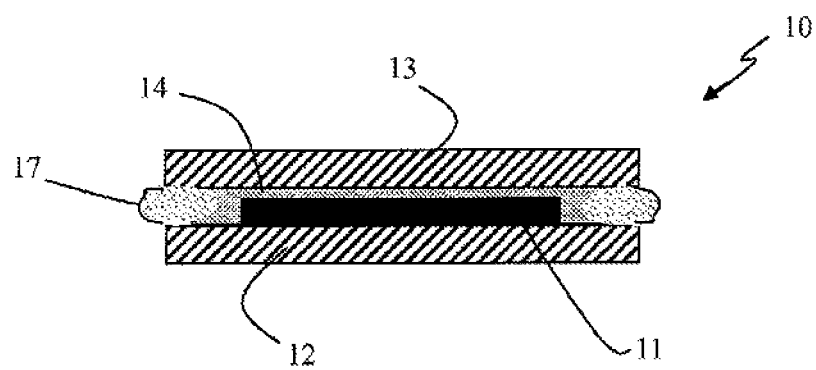
Figure 2:
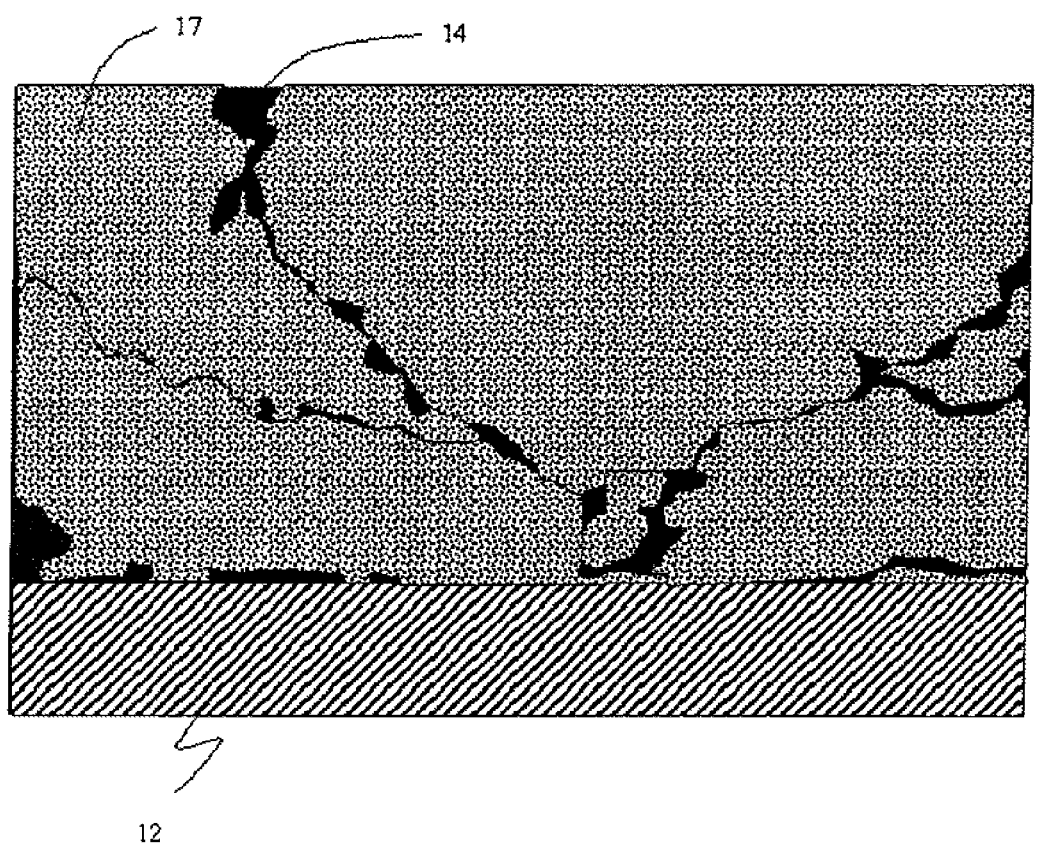
Figure 3A:
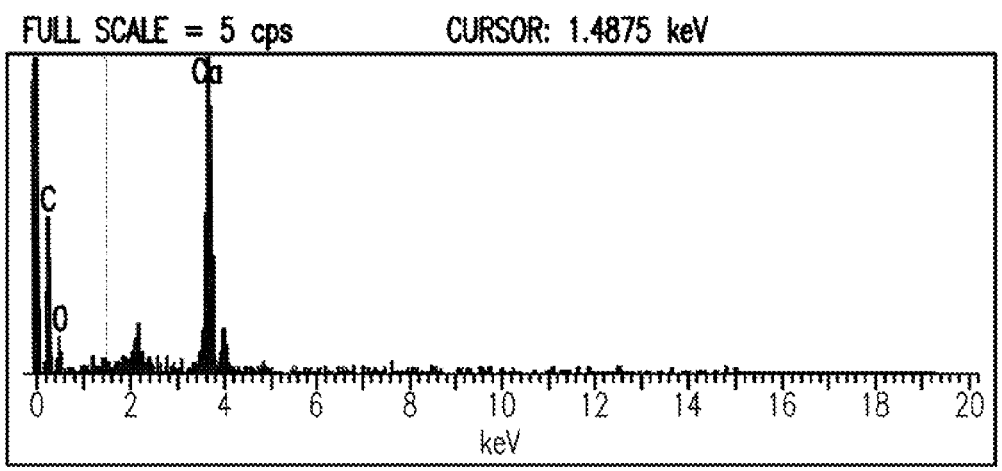
Figure 3B:
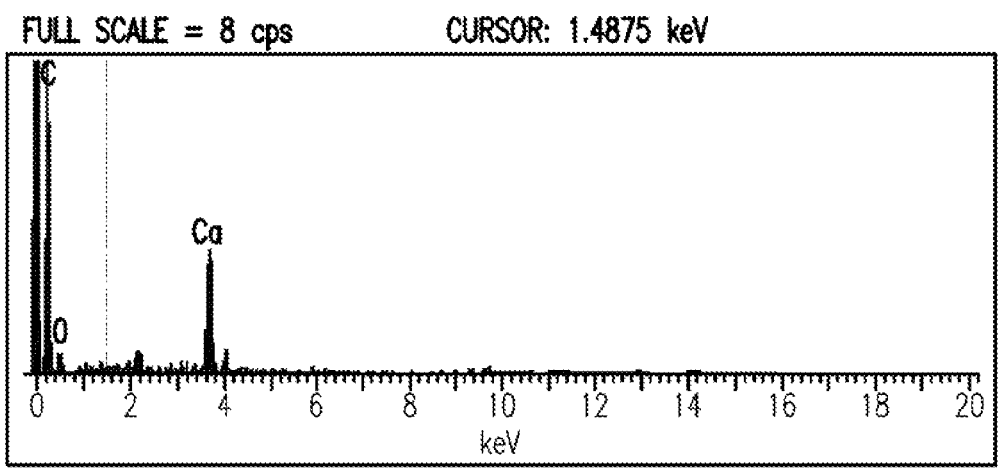
Figure 3C:
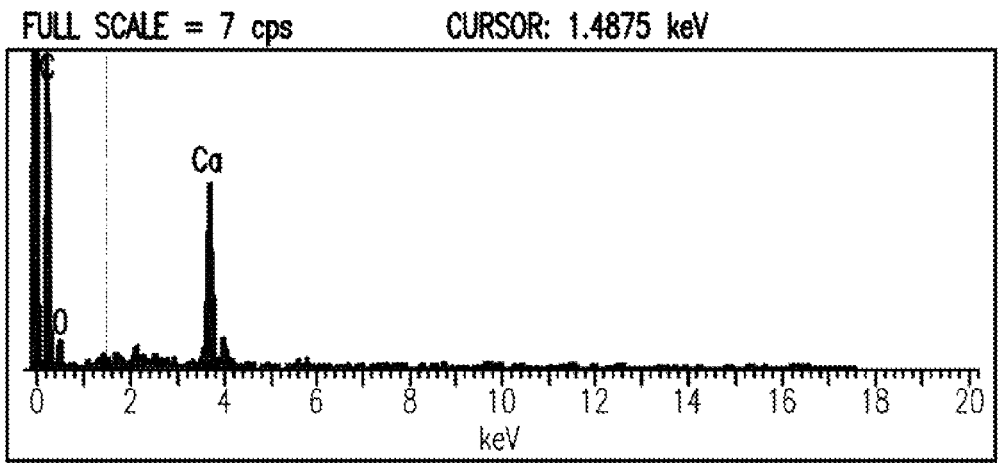

The invention will be illustrated, in the following with reference to the drawings, in which:

the FIGS. 1A and 1B represent a cross-sectional view of a photovoltaic panel manufactured according to the present invention, respectively before (1A) and after (1B) the thermosealing process;

FIG. 2 shows an enlarged detail of a polymeric tri-layer according to the present invention after being subjected to the thermosealing process; and the FIGS. 3A-3C represent EDX spectra that show the intensity of the calcium peak in various points of the tri-layer after the thermosealing process.

In the drawings the dimensions and the dimensional relations between the various elements, particularly with reference to their thicknesses, are not correct, but have been distorted for the sake of better comprehensibility of the figures. Further some constitutive elements of a photovoltaic panel, as for example electrical feedthroughs and connections, have not been shown because they are not relevant for the description of the present invention.

In the realization of the polymeric tri-layer object of the present invention is important that the two outermost polymeric layers are essentially free of $H_2O$ sorbing material, meaning that the amount of sorbing materials or moisture getters in such layers is not higher than 1 wt %. This means that the presence of small amounts of sorbing material may be tolerated since not impairing the adhesive properties of said outermost polymeric layers.

FIG. 1A shows in cross section a photovoltaic panel 10, to which the method of the invention is applied, before the operation of thermosealing of the supports. In this drawing the photovoltaic element 11 has been shown in contact with the lower support 12. This element is encapsulated by a polymeric material 14 that fills the inner volume of the photovoltaic panel delimited by the lower support 12, by the upper support 13 and by the tri-layer formed of the composite getter system 15 and of the outer polymeric layers without getter material 16, 16'; this tri-layer is arranged along the edge of the panel.

The polymer used for the outer layers 16, 16' of the tri-layer must have good adhesive properties towards the materials that form the upper and lower support of the photovoltaic panel, i.e. have an adhesion to the supports of the panel quantifiable by a shear force resistance of at least 100 KPa as measured according to the ASTM C961-06 procedure.

The information on the lap shear force (often referred also as lap shear strength) of different materials is readily available to a person skilled in the art and could be easily retrieved by a plurality of sources, see for example the publication "Moisture transport, adhesion and corrosion protection of PV module packaging materials" by Jorgensen et al, published in 2006 in the Solar energy Materials & solar Cells, pages 2739-2775, or the 2007 edition of the "Physical Properties of Polymers Handbook" edited by Springer New York; moreover the information on the lap shear force of a material to be employed in a production process of photovoltaic elements is often specified by the material supplier.

Typical materials for the manufacturing of the transparent support are vitreous materials, whereas the other support of the panel can be made of various materials, among the most common ones of which there are vitreous materials; if this support should also have the characteristic of flexibility, an aluminized polymeric foil could be used. For example, for the polymeric foil, polyvinyl fluorides can be used, among which the use of Tedlar® is preferred, both used alone or in combination with other elements as polymeric foils, or aluminized polyethylene terephthalate (PET).

FIG. 1B shows the photovoltaic panel 10 after the process of thermosealing. In this case the constituent elements of the tri-layer, i.e. the outer polymeric layers 16, 16' and the composite getter system 15 arranged in the centre of the tri-layer, soften and melt into each other and give rise to a composite 17 inside of which the $H_2O$ sorber is distributed.

This new composite getter system 17 that is formed following the softening and melting process shows a good adhesion to the supports of the photovoltaic panel in so far as the adhesive characteristics are determined essentially by those of the outer layers of the tri-layer, whereas the diffusion of the sorbing material ensures the formation of a barrier active against the ingress of $H_2O$ inside the panel.

The thermosealing of the panel occurs by heating at a temperature between 100° C. and 170° C. The manufacturing process of a photovoltaic panel foresees also a process of thermosealing, in this regards two main types of processes are used, one foresees the use of a vacuum laminator, while the other foresee the use of an autoclave. In both cases the thermosealing is usually carried out between 100 and 170° C. This process results in the softening or melting of the encapsulating polymer.

As shown in FIG. 1B, as a result of this operation it is possible that the thickness of the composite getter 17 obtained by the softening, melting and the reciprocal interdiffusion of the layers of the tri-layer results smaller than the starting thickness of the polymeric tri-layer as a consequence of the combined action of the weight of the upper support and the heating. Further it is possible that the composite getter 17 slightly stands out, both towards the inside and towards the outside of the panel 10, in which case the quantity of material that outflows from the panel is removed. This effect may be present with both the two different types of thermosealing processes.

With regard to the properties required for the used polymers, these must have a softening or melting temperature lower than 170° C.; preferably this temperature is lower than or equal to 150° C.; they must further have a low MVTR for $H_2O$, preferably lower than 10 g m$^{-2}$ d$^{-1}$ mm at 25° C. and 100% relative humidity. Polymers useful for carrying out the invention are for example EthylVinylAcetate (EVA), polyethylene of low (LDPE), medium (MDPE) and high (HDPE) density, polyether block amides (PEBA), ionomeric resins such as Surlyn™ commercialized, by DuPont, ethyleneacrylic, acid copolymers as for example Lucalen® commercialized by Basell, polyvinylidene fluoride (PVDF), PolyVinylButyral (PVB) and polyvinylidene chloride (PVDC) such as Saran™ commercialized by DOW Chemicals, Ethylene-Propylene Rubbers (EPR), Ethylene Propylene Diene Monomer Rubbers (EPDM) and butyl rubbers.

It is pointed out that the $H_2O$ transmission, like also the softening or melting temperature, are not linked univocally to the type of polymer but are functions of various parameters, among which the composition is one of the most relevant ones; thus it is important not to choose the polymer on the basis of the class it belongs to but on the basis of its $H_2O$ transmission and the softening or melting temperature, this information being easily available to an expert in the field. For example, as far as the transmission characteristics of EVA are concerned, this information is available in the article by Marais et al. "Permeation and Sorption of Water and Gases through EVA Copolymers Films" published in 2002 in Mat. Res. Innovation, Vol. 6, pp. 79-88.

With regard to the characteristics of the polymers used for the outer layers of the tri-layer, these must further have good adhesive characteristics to the supports of the photovoltaic panel, quantifiable by a shear force resistance measured according to the ASTM C961-06 procedure of at least 100 KPa. In any case, independently by the specific characterizing method adopted for assessing the lap shear resistance, it has to be intended that the good adhesion properties of the outer polymeric layers are triggered or enhanced by thermal processes, such as the one specified in ASTM C961-06 or as the ones deriving from the thermosealing process of the photovoltaic module.

The adhesive properties of these polymers can be improved by adding suitable additives such as for example silanes or polyolefines functionalized by maleic anhydride wafting.

In a preferred embodiment the tri-layer is composed of the same type of polymer, with the only difference that the outer polymeric layers of the tri-layer have added silanes to improve the adhesive characteristics thereof in order to reach the lap shear resistance of at least 100 KPa. In an even more preferred embodiment this common polymeric material is the same as the polymeric material used for encapsulating the photovoltaic element; in this latter case the use of EVA result to be very advantageous.

The above-mentioned supports of the photovoltaic panel can be made from glass or, in the case it is desired to obtain flexible panels, can be made from plastic materials such as ethylene tetrafluoroethylene (ETFE).

In the case in which the polymeric materials that form the initial tri-layer are different from each other, it is important that the polymeric material of the composite getter system is, at its softening or melting temperature, miscible with the polymeric material forming the outer layers of the tri-layer.

With regard to the materials for $H_2O$ sorption are concerned, zeolites, silica gels, alumina and alkaline earth metal oxides can be used.

The composite getter system for the $H_2O$ sorption that forms the central part of the tri-layer has a weight percentage of the $H_2O$ sorbing material comprised between 10 and 60 wt %, preferably comprised between 30 and 45 wt %. It is important that the quantity of $H_2O$ sorbing material must be not less than 10% by weight, in order to have an efficient barrier. It is important to remember that this quantity by diffusing also in the outer polymeric layers of the tri-layer during the thermosealing process creates the barrier active against the entry of $H_2O$ into the photovoltaic cell, whereby the medium concentration of the sorbing material of the composite getter system 17 obtained after the softening and melting of the starting tri-layer is necessarily lower with respect to the starting composite getter system one, resulting in the lower limit given above.

The inventors have determined that when operating under the conditions of the invention the sorbing material is diffusing also in proximity of the supports of the photovoltaic panel, thus creating a barrier active against the ingress of $H_2O$ inside the device, without however compromising the adhesive characteristics that the interface between the two supports must have.

In a second aspect thereof the invention consists in a polymeric tri-layer for the manufacturing of photovoltaic panels, characterized in that the outermost are essentially without getter material, whereas the innermost layer is a composite getter system composed of a polymer with inside a dispersion of a moisture getter material.

Moreover, the outermost layers have good adhesive characteristics, quantifiable by a shear force resistance of at least 100 kPa.

Example 1

A tri-layer is manufactured using two outer layers with a thickness of 0.6 mm of EVA comprising an additive belonging to the family of silanes that acts as adhesion promoter. The inner layer with a thickness of 1.4 mm is composed of EVA loaded by 40% in weight with calcium oxide powder. The previous tri-layer is used as interface between two glass supports simulating thus the structure of a photovoltaic panel. The sample obtained in this way is subsequently subjected to a light compression and a thermal process at 150° C. for 30 minutes, similar to that of thermosealing in a photovoltaic panel. The shear force resistance for this sample after a thermosealing performed as described above is 5200 KPa.

FIG. 2 shows the representation of a photograph of the contact region between the lower support 12 and the tri-layer after that this has been subjected to the thermal treatment of thermosealing that has caused the softening and melting of the layers, showing the parts without sorbing material 14, and the parts 17 that contain said sorbing material.

It has been chosen to show the photographic representation and not to include the original photograph due to legibility problems connected to the printing quality of the latter one.

Example 2

A sample prepared in a similar way to what described in example 1 is analysed by means of an energy dispersive X-ray micro-analyser (Oxford Energy Dispersive X-Ray Spectroscopy) connected to a scanning electron microscope (SEM Leica Stereoscan 420) in order to obtain a qualitative and quantitative evaluation of the chemical composition of the sample subjected to analysis. The spectra obtained in correspondence of the central section, of the upper support and of the lower support are shown respectively in the FIGS. 3A, 3B, 3C.

Example 3

A tri-layer is manufactured in a manner similar to sample 1 but using as central layer MDPE loaded with 35% in weight with calcium oxide powder. The thickness of the central layer is 0.75 mm. Also this tri-layer is used as interface between two glasses supports simulating thus the structure of a photovoltaic panel. The sample obtained in this way is subjected to a light compression and a thermal process at 150° C. for 30 minutes, similar to that of thermosealing in a photovoltaic panel.

The shear force resistance for this sample after a thermosealing performed as described above is 4300 KPa.

Example 4

Comparative

A 2 mm mono-layer is manufactured in a manner similar to the central layer of example 3. The higher thickness of this example enables to make a direct comparison with example 3 tri-layers. This monolayer is used as interface between two glasses supports simulating thus the structure of a photovoltaic panel. The sample obtained in this way is subjected to a light compression and a thermal process at 150° C. for 30 minutes, similar to that of thermosealing in a photovoltaic panel.

In this case the sample did now show any adhesive feature and the two glasses were easily separated.

FIG. 2 shows that operating under the conditions of the invention the sorbing material diffuses also in correspondence of the vitreous support, i.e. it is possible, starting from an initial situation in which the concentration of the sorbing material is highly non-uniform (being present only in the central region of the tri-layer), to arrive at a situation where the sorbing material is diffused also in correspondence of the vitreous surfaces, thereby eliminating the preferential regions for the ingress of $H_2O$ in the system. The efficiency of this solution can actually be deduced from FIG. 2, where it can be seen how the particles of the $H_2O$ sorber (in the parts 17) arrive in contact with the vitreous support, thus eliminating preferential paths for the ingress of $H_2O$.

The FIGS. 3A, 3B, 3C show that there are significant quantities of sorber, represented by the calcium peak, also in correspondence to the supports, as confirmation of the fact that the method of the invention allows to obtain a composite getter with good barrier properties along the total of its thickness from the softening and melting of a starting polymeric tri-layer characterized by the presence of a composite getter layer arranged in its central part.

The invention claimed is:

1. A polymeric tri-layer for the manufacturing of photovoltaic panels, wherein the two outermost layers are composed of a polymeric material essentially without getter material, whereas the central layer is composed of a composite getter system for $H_2O$ sorption.

2. The polymeric tri-layer according to claim 1, in which said polymeric material that is essentially without getter material thereby provides an adhesion property quantifiable by a shear force resistance of at least 100 KPa.

3. The polymeric tri-layer according to claim 1, further comprising an additive material that is added to said outer polymeric layers for enhancing an adhesion property of said outer polymeric layers.

4. The polymeric tri-layer according to claim 1, wherein said layers have a softening or melting temperature lower than 170° C.

5. The polymeric tri-layer according to claim 1, wherein the central layer in contact with the outermost layers has a weight percentage of a $H_2O$ sorber inside said composite getter system being between 10 and 60 wt %.

6. The polymeric tri-layer according to claim 5, wherein the $H_2O$ sorber is selected from zeolites, silica gels, alumina and alkaline earth metal oxides.

7. The polymeric tri-layer according to claim 1, wherein said layers have a $H_2O$ transmission lower than 10 g m$^{-2}$d$^{-1}$ mm at 25° C. and 60% RH.

8. The polymeric tri-layer according to claim 1, in which said polymeric material that is essentially without getter material thereby provides a desired adhesion property.

9. The polymeric tri-layer according to claim 1, wherein the two outermost layers and central layer are composed of the same type of polymeric material and wherein the outermost layers have added silanes.

10. A polymer composition for manufacturing photovoltaic panels, capable of exhibiting a first stage and a second stage, wherein:
   in the first stage, the polymeric composition is a polymeric tri-layer, of which the two outermost layers are composed of a polymeric material essentially without getter material, whereas the central layer is composed of a composite getter system for $H_2O$ sorption; and
   in the second stage, the polymeric composition is an adhesive composite comprising $H_2O$ getter material distributed therein, the second stage being obtained by softening and reciprocal interdiffusion of the tri-layer upon heating the first stage to a temperature comprised between 100° C. and 170° C.

11. A polymeric tri-layer directed at separating an adhesion aspect and a $H_2O$ sorption aspect, the polymeric tri-layer comprising:
a central layer composed of a getter material for $H_2O$ sorption; and
a pair of outer layers that are substantially free of said getter material thereby providing a desired adhesion property.

12. The polymeric tri-layer according to claim 11, wherein the desired adhesion property is triggered or enhanced by heating.

13. The polymeric tri-layer according to claim 11, wherein the desired adhesion property is enhanced by addition of an additive.

14. The polymeric tri-layer according to claim 13, wherein addition of the additive enhances the desired adhesion property to obtain a lap shear resistance of at least 100 KPa.

15. The polymeric tri-layer according to claim 13, wherein the additive comprises at least one of a silane or a polyolefine functionalized by maleic anhydride grafting.

16. The polymeric tri-layer according to claim 11, wherein said getter material is limited to not higher than 1 wt % in said pair of outer layers.

17. The polymeric tri-layer according to claim 11, wherein said getter material in said central layer has a weight percentage between 10 and 60 wt %.

18. The polymeric tri-layer according to claim 11, wherein said getter material in said central layer has a weight percentage between 30 and 45 wt %.

19. The polymeric tri-layer according to claim 11, wherein said desired adhesion property accommodates attaching the polymeric tri-layer to one or more supports of a photovoltaic panel.

* * * * *